(12) United States Patent
Son et al.

(10) Patent No.: US 7,674,660 B2
(45) Date of Patent: Mar. 9, 2010

(54) MULTILEVEL SEMICONDUCTOR DEVICE AND METHOD OF MANUFACTURING THE SAME

(75) Inventors: Yonghoon Son, Yongin (KR); Sungkwan Kang, Seou (KR); Jongwook Lee, Yongin (KR)

(73) Assignee: Samsung Electronic Co., Ltd., Suwon-Si (KR)

( * ) Notice: Subject to any disclaimer, the term of this patent is extended or adjusted under 35 U.S.C. 154(b) by 751 days.

(21) Appl. No.: 11/491,396

(22) Filed: Jul. 22, 2006

(65) Prior Publication Data
US 2007/0170433 A1 Jul. 26, 2007

(30) Foreign Application Priority Data
Jan. 24, 2006 (KR) .............. 10-2006-0007133

(51) Int. Cl.
H01L 21/00 (2006.01)
H01L 21/20 (2006.01)

(52) U.S. Cl. ............... 438/152; 438/486; 438/187

(58) Field of Classification Search .......... 257/E21.614, 257/E23.011, E27.026, E27.064, E29.126, 257/E29.137, 29.137; 438/152, 166, 486, 438/487, E21.614
See application file for complete search history.

(56) References Cited

U.S. PATENT DOCUMENTS 5,852,310 A 12/1998 Kadosh et al. ............. 257/67
6,429,484 B1 8/2002 Yu ......................... 257/347
6,943,067 B2 * 9/2005 Greenlaw .................. 438/152
7,387,919 B2 * 6/2008 Kwak et al. ............... 438/153
7,435,634 B2 * 10/2008 Kim et al. ................. 438/153

* cited by examiner

Primary Examiner—Hung Vu
(74) Attorney, Agent, or Firm—F. Chau & Associates, LLC

(57) ABSTRACT

A method of fabricating a multilevel semiconductor integrated circuit is provided, comprising: forming on a first active semiconductor structure a first plurality of transistors with respective gate structures disposed on a first substrate and source or drain regions disposed within the first substrate; depositing a first insulation layer on the first substrate and the gate structures; etching the insulation layer to form a plurality of openings exposing portions of the first substrate contacting the bottoms of the openings; forming a semiconductor seed layer filling the openings; forming an amorphous layer on the seed layer and the insulation layer; subjecting the first active semiconductor structure to at least one application of laser irradiation to transform the amorphous layer to a crystalline semiconductor layer having a protrusion region with a peak at or near the middle of two adjacent openings; forming on a second active semiconductor structure a second plurality of transistors with respective gate structures disposed on the crystalline semiconductor layer and forming a contact structure to electrically connect a transistor of the first active semiconductor structure to a transistor of the second active semiconductor structure.

21 Claims, 5 Drawing Sheets

MULTILEVEL SEMICONDUCTOR DEVICE AND METHOD OF MANUFACTURING THE SAME

This application claims priority to Korean application 2006-0007133, filed on Jan. 24, 2006, the disclosure of which is incorporated by reference herein. This application is related to U.S. application Ser. No. 11/481,633, filed on Jul. 6, 2006, the disclosure of which is incorporated by reference herein.

TECHNICAL FIELD

The present disclosure relates to a multilevel semiconductor device and methods of manufacturing the same; in particular, the present disclosure relates to a multilevel integrated circuit having a contact structure with low contact resistance and methods of manufacturing the same.

DISCUSSION OF RELATED ART

Transistors are generally formed within a silicon-based substrate of a semiconductor integrated circuit. Traditionally, the number of transistors per integrated circuit has been limited by the available surface area of the substrate. Accordingly, efforts have been directed to increasing the level of integrated circuits by forming multilevel devices having transistors on two or more levels.

Multilevel devices having transistors on two or more levels include transistors located on the substrate as well as transistors located on a layer or layers above the substrate. For example, transistors are formed on the silicon substrate as well as on an interlayer dielectric (ILD) layer formed on the bottom transistor. An elevated substrate is formed on the ILD layer and an upper transistor is formed on the elevated substrate.

Contact structures such as metallic stubs or wires are then provided to connect transistors on the silicon substrate with transistors on the elevated substrate. For example, a contact structure extends vertical downward to a source/drain region of a transistor formed on the (bottom) substrate and laterally to a source/drain region of a transistor on the elevated substrate. The contact area of the contact structure with the source/drain region of the transistor at the elevated level is formed at the sidewall of the contact structure. The contact area of the contact structure with the bottom substrate is usually larger than the contact area at the elevated level because the diameter of the contact structure is usually larger than the thickness of the substrate at the elevated level.

The substrate on the elevated level is usually formed by performing CMP to level the interlayer dielectric layer covering the transistors of a lower level or in some cases by growth of an active semiconductor layer. In both cases, the substrate of the elevated level has substantially the same thickness throughout. The substrates of the multilevel semiconductor device tend to be kept thin so that more components can be populated or the device is smaller. However, the thinner the thickness of the substrate of the elevated level, the smaller is the contact area between the contact structure and the source/drain region, resulting in higher contact resistance.

A need therefore exists for a method of making thin active layers or substrates with connections having lower contact resistance.

SUMMARY OF THE INVENTION

A method of fabricating a multilevel semiconductor integrated circuit is provided, comprising: forming on a first active semiconductor structure a first plurality of transistors with respective gate structures disposed on a first substrate and source or drain regions disposed within the first substrate; depositing a first insulation layer on the first substrate and the gate structures; etching the first insulation layer to form a plurality of openings exposing portions of the first substrate contacting the bottoms of the openings; filling the openings with semiconductor material the same as in the first substrate; forming a second active semiconductor layer on the insulation layer and the filled openings; subjecting the second active semiconductor layer to at least one application of laser irradiation to form a protrusion region with a peak at or near the middle of two adjacent openings; forming on a second active semiconductor structure a second plurality of transistors with respective gate structures disposed on the second active semiconductor layer and sources and drains within the second active semiconductor layer; depositing a second insulation layer on the second active semiconductor layer and the gate structures of the second plurality of transistors; etching a portion of the second insulation layer at or near the peak of the protrusion region to form a contact hole extending to the surface of the first substrate; and depositing a conductive layer in the contact hole to form a contact structure to electrically connect a transistor of the first active semiconductor structure to a transistor of the second active semiconductor structure, wherein the contact structure contacting the transistor of the second semiconductor structure has a contact area length greater than the thickness of the second active semiconductor layer away from the contact structure.

Preferably, the second active semiconductor layer is a single crystalline semiconductor layer formed by exposing an amorphous layer to a first irradiation at a first energy level and then a second laser irradiation at a second energy level, the second energy level is higher than the first energy level, wherein the first energy level is set to partially melt upper portions of the amorphous layer but leave lower portions of the amorphous layer contacting the filled openings in a solid state, and wherein the openings are dimensioned to facilitate a predominant portion of thermal flow from the second laser irradiation as compared to the portion of thermal flow through the insulation layer, thereby forming the protrusion region having the peak.

According to an embodiment of the invention, the thickness of the amorphous layer is less than 1000 nm. The thickness of the protrusion region at the peak is about 1.5 times the thickness of the second active semiconductor layer at the openings, and the thickness of the protrusion region at the thinnest portion is about 0.5 times the thickness of the peak.

According to an embodiment of the invention, the step of filling the openings includes selective epitaxial growth from the portions of the first substrate contacting the bottom of the openings. The second active semiconductor layer, the filled openings, and the first substrate have a single crystalline structure. The semiconductor is silicon or germanium.

A multilevel semiconductor integrated circuit (IC) is also provided, comprising: a first active semiconductor structure having a first plurality of transistors with respective gate structures disposed on a substrate and sources and drains disposed within the substrate; a first insulation layer formed on the substrate and the gate structures; a second active semiconductor structure formed on the insulation layer of the first active semiconductor structure, the second active semiconductor structure having a second plurality of transistors with respective gate structures formed on a semiconductor crystalline layer and sources and drains within the crystalline semiconductor layer, the semiconductor crystalline layer having a varied thickness; and a contact structure having a bottom and a sidewall extending vertically from the surface of the substrate, the bottom forming a first contact with the surface of the substrate and a portion of the sidewall forming a second contact with the semiconductor crystalline layer, wherein the second contact is disposed at the thickest portion of the semiconductor crystalline layer.

The integrated device further includes a plurality of vias extending from the surface of the substrate to the bottom of the semiconductor crystalline layer, wherein the contact structure is disposed in the middle of two adjacent vias.

According to an embodiment of the invention, the semiconductor crystalline layer and the substrate is made of the same material, preferably silicon or germanium. The second contact is about 10 nm to about 200 nm in length. According to another embodiment of the invention, a third active semiconductor structure having a third plurality of transistors is disposed above the second active semiconductor structure.

According to another embodiment of the invention, a multilevel semiconductor integrated circuit is provided, comprising: a first level circuit structure having a first substrate and a plurality of transistors; a second level circuit having a second substrate and a plurality of transistors disposed above the first level circuit structure, the second substrate having a varied thickness; a contact structure disposed vertically to connect a transistor of the first level circuit structure to a transistor of the second level structure, the contact structure contacting the transistor of the second level at the thickest portion of the second substrate.

The integrated circuit device includes a plurality of vias extending from the surface of the first substrate to the bottom of the second substrate, and the contact structure is disposed in the middle of two adjacent vias. The first substrate and the second substrate is made of the same material, preferably silicon or germanium.

According to still another embodiment of the present invention, a method of fabricating a multilevel semiconductor integrated circuit is provided, comprising: forming on a first active semiconductor structure a first plurality of transistors with respective gate structures disposed on a first substrate and source or drain regions disposed within the first substrate; depositing a first insulation layer on the first substrate and the gate structures; etching the insulation layer to form a plurality of openings exposing portions of the first substrate contacting the bottoms of the openings; forming a semiconductor seed layer filling the openings; forming an amorphous layer on the seed layer and the insulation layer; subjecting the first active semiconductor structure to at least one application of laser irradiation to transform the amorphous layer to a crystalline semiconductor layer having a protrusion region with a peak at or near the middle of two adjacent openings; forming on a second active semiconductor structure a second plurality of transistors with respective gate structures disposed on the crystalline semiconductor layer and sources and drains within the crystalline semiconductor layer; depositing a second insulation layer on the crystalline semiconductor layer and the gate structures of the second plurality of transistors; etching a portion of the second insulation layer at or near the peak of the protrusion region to form a contact hole extending to the surface of the first substrate; and depositing a conductive layer in the contact hole to form a contact structure to electrically connect a transistor of the first active semiconductor structure to a transistor of the second active semiconductor structure.

Preferably, the crystalline layer is a single crystalline semiconductor layer formed by exposing the amorphous layer to a first irradiation at a first energy level and then a second laser irradiation at a second energy level, the second energy level is higher than the first energy level, wherein the first energy level is set to partially melt upper portions of the amorphous layer but leave lower portions of the amorphous layer contacting the seed layer in a solid state, and wherein the openings are dimensioned to facilitate a predominant portion of thermal flow from the second laser irradiation as compared to the portion of thermal flow through the insulation layer, thereby forming the protrusion region having the peak.

According to an embodiment of the invention, the semiconductor seed layer is formed by selective epitaxial growth using the same material as the first substrate, or by filling the openings with the same material as the first substrate. The semiconductor material is preferably silicon or germanium.

DETAIL DESCRIPTION OF PREFERRED EMBODIMENTS

Preferred embodiments of the present invention are described with reference to the accompanying drawings.

According to an embodiment of the present invention, a first level substrate having transistors disposed thereon are made to be thermally connected to a second level active layer having transistors disposed thereon by a plurality of openings filled with the same semiconductor material. Thus, the first level substrate, the second level active layer, and the filled openings are made of the same semiconductor material. According to an embodiment of the invention, the same semiconductor material also has a single crystalline structure. When heat is applied to the device, a predominant portion of the heat flows from the elevated level active layer to the lower level substrate via the filled openings, thereby thinning the thickness of the elevated level active layer adjacent to the filled openings and creating a protrusion region away from the openings, the protrusion region having a thickness at the peak that is thicker than the thickness of the elevated level active layer prior to application heat. When a contact structure is formed at or near the protrusion, a contact formed at the sidewall of the contact structure with the elevated active layer has a contact area that is larger that the contact if the contact structure is formed away from the protrusion.

Figure 1A:
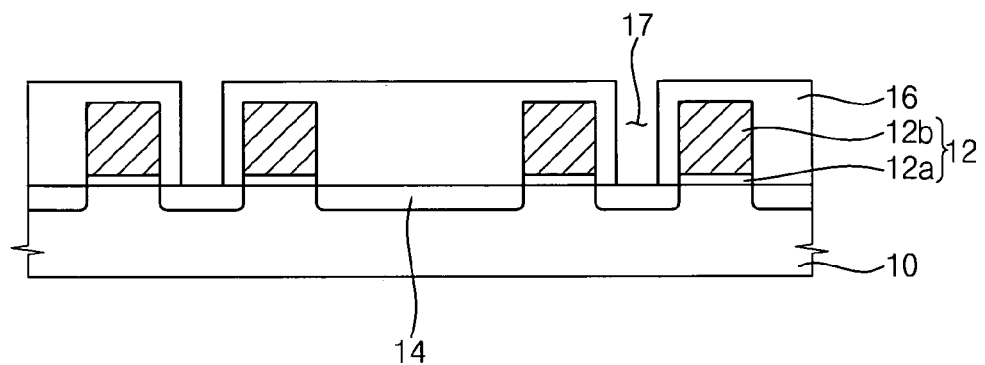
FIGS. 1A to 1H are cross-sectional views illustrating processing steps in manufacturing a multilevel semiconductor integrated circuit device according to exemplary embodiments of the present invention.

FIGS. 1A to 1H are cross-sectional views illustrating processing steps in manufacturing a multilevel semiconductor integrated circuit device according to another embodiment of the present invention. As shown in FIG. 1A, a first gate structure 12 includes gate dielectric layer 12a and gate electrode 12b formed on an active semiconductor substrate 10. A transistor can be formed with a gate structure such as the first gate structure 12 connecting to a source and a drain via source/drain region 14. The source/drain region is disposed within substrate 10. A first interlayer dielectric layer 16 is formed on the gate structure 12 and the substrate 10. Insulation material such as an oxide layer can be used as the interlayer dielectric layer 16. An etching process is performed on the first interlayer dielectric layer 16 using a photoresist pattern as an etching mask to form seed windows 17, which are openings through which portions of the top surface of the substrate 10 contacting the openings are exposed.

Figure 1B:
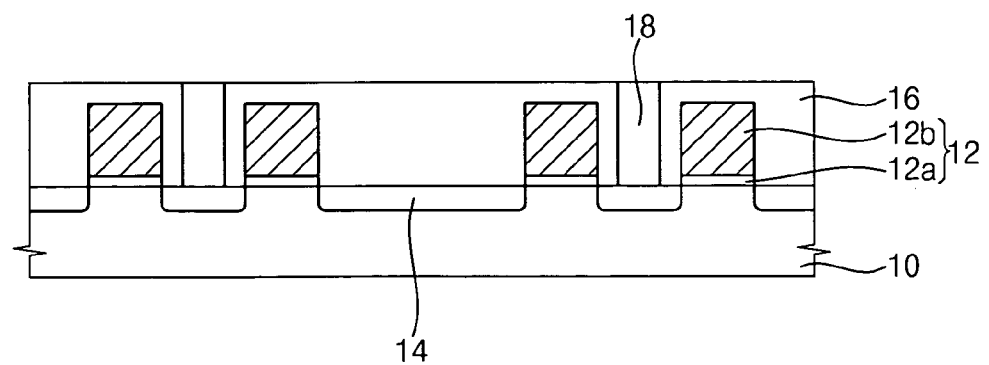

Referring to FIG. 1B, the openings 17 are filled with a semiconductor seed layer 18. According to the present embodiment, the semiconductor seed layer 14 is formed by growth from the exposed portions of the semiconductor substrate 10 through the bottoms of the openings 17, e.g., by performing a Selective Epitaxial Growth (SEG) process. The seed layer 18 formed by SEG from the semiconductor substrate 10 is a single crystalline epitaxial layer having the same material as the material of the semiconductor substrate 10. According to an alternative embodiment of the present invention, the seed layer 18 can be formed by filling the openings 17 with a material same as the material of the substrate 10. Then, the seed layer 18 can be grown from the deposited material to fill the openings. The semiconductor substrate 10 is made of semiconductive material, such as silicon or germanium. For purposes of illustrating a preferred embodiment of the present invention, silicon is described as the semiconductor material used therein. Thus, the seed layer 18 formed by SEG from the semiconductor substrate 10 or by filling the openings 17 is single crystalline silicon.

Figure 1C:
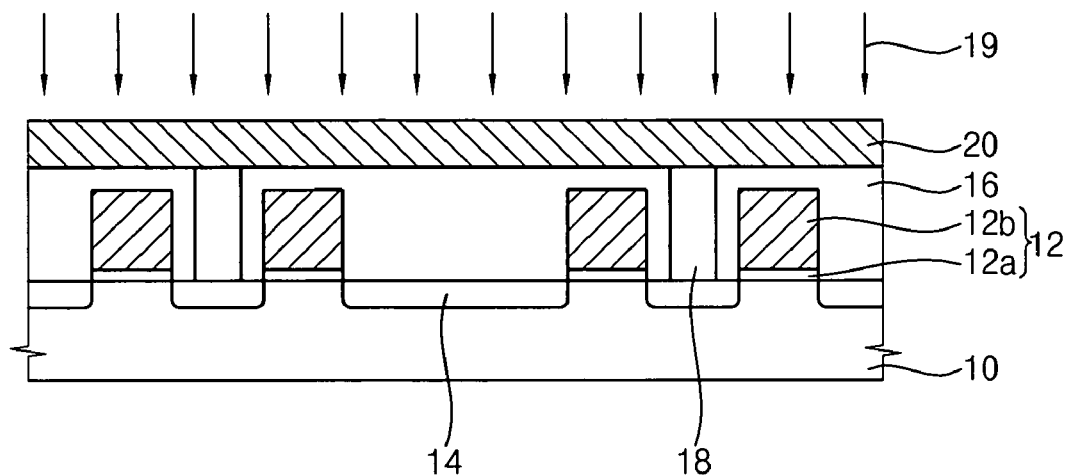

A thin film is formed on the interlayer dielectric layer 16 and the seed layer 18. The thin film will serve as the active layer of a second level with transistors. The thin film is preferably made from the same semiconductor material in substrate 10. According to an embodiment of the present invention, the thin film is of a single crystalline structure, also the same as in the substrate 10 and the seed layer 18. It is known to one skilled in the art that electronic mobility and thus electrical conduction is superior in single crystalline structure components. As Shown in FIG. 1C, a non-single crystalline layer, i.e., a layer which does not have a defined crystalline structure, such as in an amorphous silicon layer 20, is formed on the insulation layer 16 and the seed layer 18 using, for example, a Chemical Vapor Deposition (CVD) process. In an illustrative embodiment of the present invention, the amorphous silicon layer is uniformly deposited on the insulation layer 16 and the seed layer 18 so that the thickness is substantially the same throughout. The thickness of the amorphous silicon layer can range from about 10 nm to about 1,000 nm. Preferably, the amorphous silicon layer is between about 20 nm to about 500 nm.

The amorphous layer 20 is transformed to a single crystalline structure layer by application of heat using laser irradiation 19. Preferably, when the amorphous silicon layer 20 on top of the seed layer 18 is heated to a partially melted condition, such as by exposure to laser irradiation 19, the amorphous layer first transforms to a layer having a polycrystalline structure. A second laser irradiation can be applied to the polycrystalline structure layer to completely melt the polycrystalline structure and the seed layer 18. When the layer recrystalizes, a single crystalline structure layer is formed. According to an embodiment of the present invention, the amorphous silicon layer 20 is exposed to a first laser irradiation at an energy level to heat the amorphous silicon layer 20 to a temperature equal to or higher than the melting point of the amorphous silicon. Preferably, the first laser irradiation 19 is set to an energy level so that the amorphous layer 20 is melted at the upper portion of the amorphous layer and the lower portion of the amorphous layer contacting the seed layer 18 remains in a solid state. When the melted amorphous silicon recrystalizes, a silicon layer 20 having polycrystalline structure, i.e., grains aligned in an approximately regular pattern with multiple defined boundaries, is formed. According to the present illustrative embodiment, a solid state excimer laser irradiating at a range of about 200 to about 2,000 millijoules per square cm is used; more preferably, the laser irradiates at a range of about 200 to about 700 millijoules per square cm. Alternatively, a solid state or a CW laser may also be used.

Figure 1D:
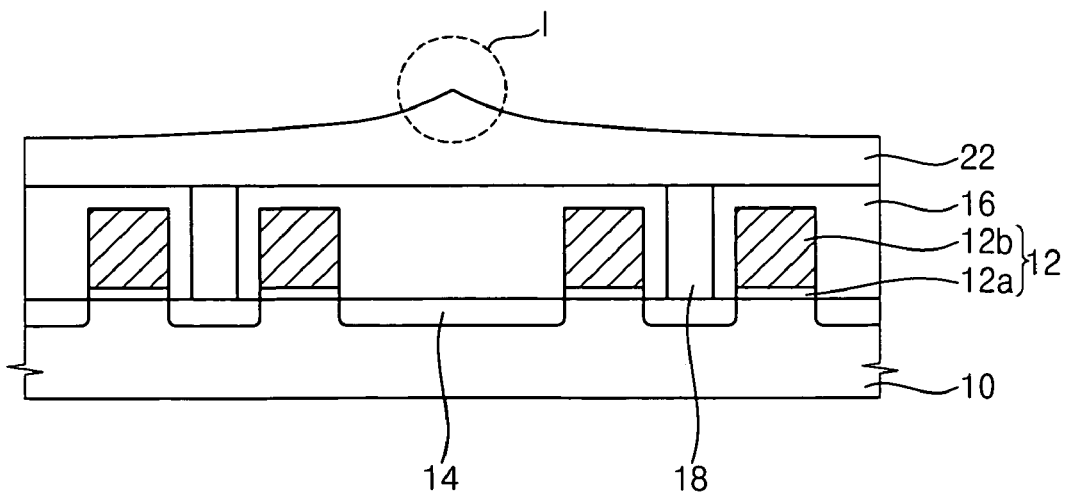

A single crystalline layer is formed by exposing the polycrystalline layer 20 to a second laser irradiation. Preferably, the second laser irradiation 19 is set to irradiate at a higher energy level than the first laser irradiation 17. According to an embodiment of the present invention, the higher energy level of the second laser irradiation 19 should heat the device to a temperature beyond the melting point of the polycrystalline silicon structure, sufficient to anneal both the polycrystalline layer 20 and the seed layer 18. The bonding of the melted polycrystalline silicon structure and the single crystal silicon seed material in layer 18 transforms the polycrystalline layer to a single crystalline layer 22 upon recrystallization, as shown in FIG. 1D. According to the present illustrative embodiment of the present invention, the second laser irradiation 19 is set at an energy level greater than 700 millijoules/square cm; more preferably, the energy level ranges from 800 to about 3,000 millijoules/square cm. According to another embodiment of the present invention, the openings 17 exposing the substrate 10 at the bottom of the openings is about 10 nm to about 100 nm in diameter or width and length and the insulation layer is about 200 nm to about 1,000 nm in thickness.

It is noted that the silicon seed layer 18 formed in the openings 17 serves various functions including: (1) the provision of single crystal silicon seed material to bond with the polycrystalline silicon material in layer 20 when the device is heated by the second laser irradiation and upon recrystallization, a silicon thin film having a single crystalline structure is formed; and (2) the provision of a thermal conduit from the polycrystalline layer, through the seed layer 18, to the substrate 10. Heat generated from laser irradiation that often become trapped between the top layer and the insulation layer can be alleviated through the thermal conduit to the substrate 10. In operation, the thermal flow through the thermal conduit predominates the thermal flow through the insulation layer. Thus, as can be seen in FIG. 1D, the single crystalline layer 22 is shaped to have a thinner portion at or near the seed layer 18 and a protrusion region 34 near the middle between seed layers 18, the protrusion region having at its peak a thickness about one and half to two times the thickness of the region at or near seed layer 18. Thus, the amorphous layer 20 that started with a thickness of about 500 nm to 1,000 nm has a thickness at the peak of layer 22 of about 750 nm to 1,500 nm.

Figure 1E:
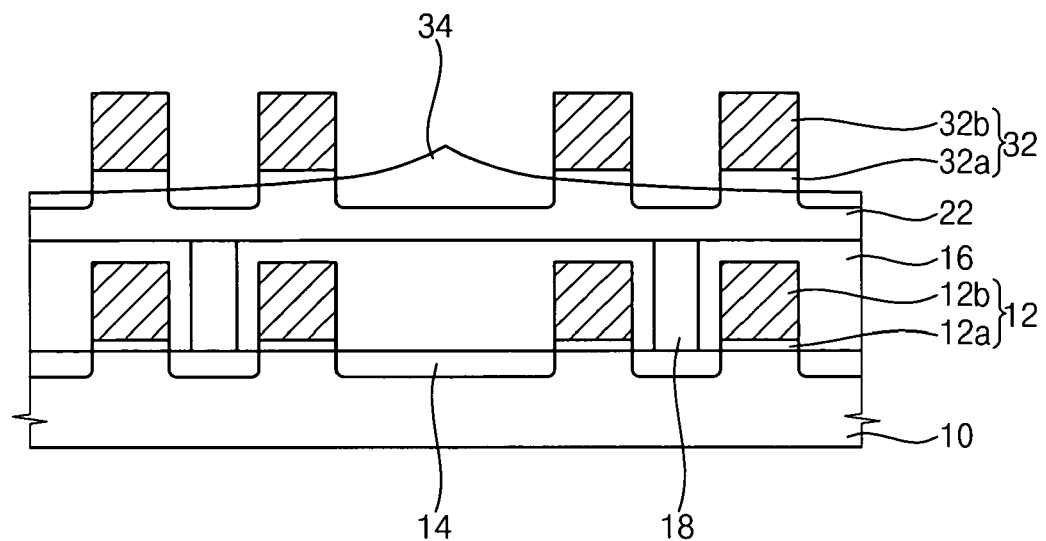

To form a multi-level integrated circuit, a second level circuit structure is formed on top of the first circuit structure. Referring to FIG. 1E, the single crystalline structure layer 22 serves as a second active semiconductor substrate and a second gate structure 32 is formed on the second active semiconductor substrate 22, disposed on top of and substantially corresponding to the location of first gate structure 12. Source and drain corresponding to the gate structure 32 are formed within the second active semiconductor substrate 22. Preferably, no CMP is performed on the second semiconductor substrate 22 so that the protrusion region 34 is maintained.

Figure 1F:
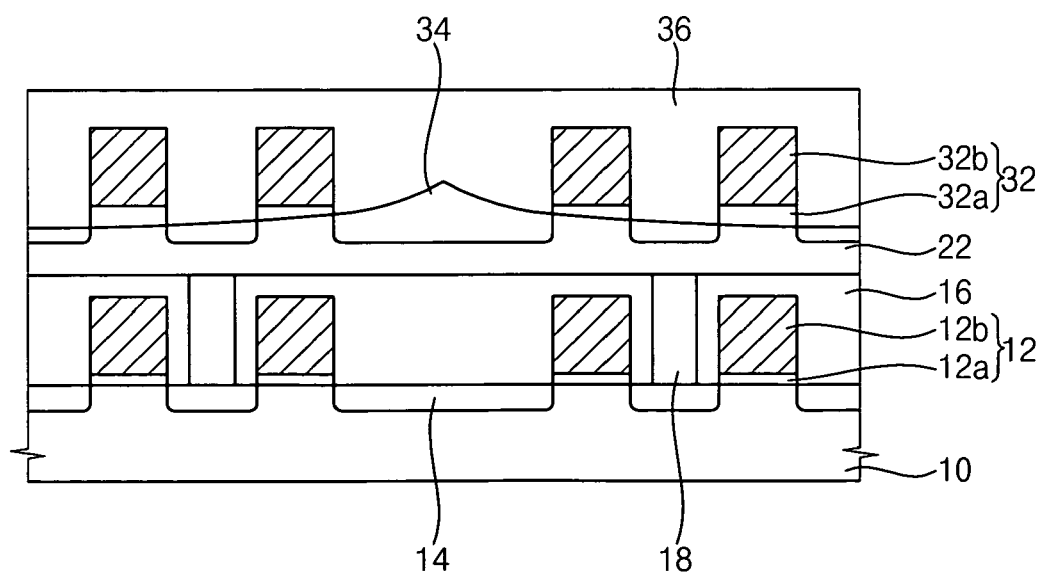

Referring to FIG. 1F, a second interlayer dielectric layer 36 is formed on the second semiconductor substrate 22 and gate structure 32. The deposition of the layer 36 is preferably by chemical vapor deposition.

Figure 1G:
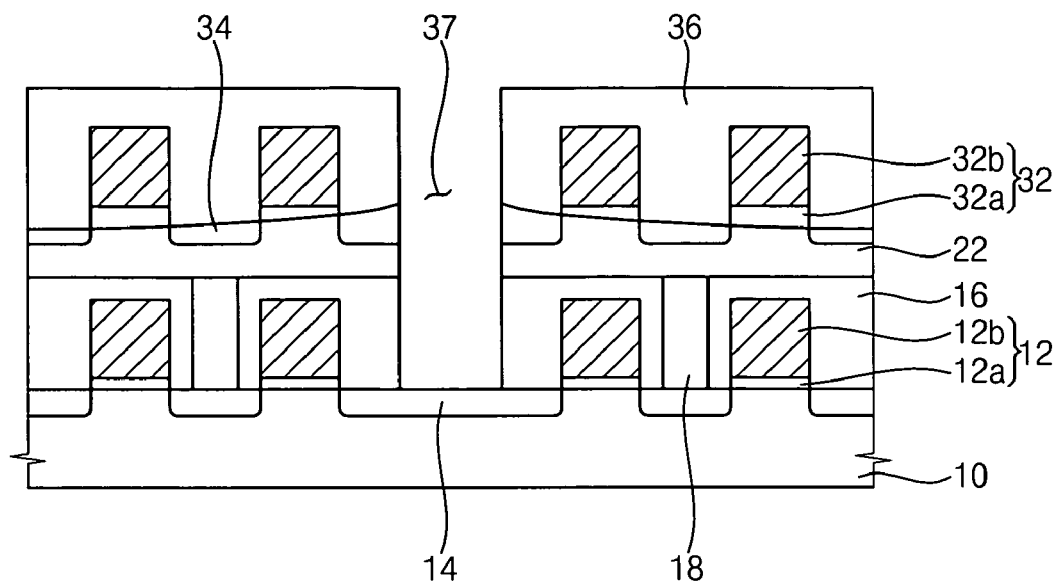

To connect transistors of the lower level to transistors of the upper level, contact structures are formed. Referring to FIG. 1G, a contact hole 37 is formed by etching the second dielectric interlayer layer 36 at or around the peak of the protrusion region. The contact hole 37 extends through the first and the second interlayer dielectric layers, exposing at the bottom of the contact hole 37 an upper surface of the first semiconductor layer 10, and on a side of the contact hole 37 a sidewall of the second semiconductor layer 22. According to the present embodiment, the bottom of the contact hole 37 contacts the drain or source 14 in the first semiconductor layer 10.

Figure 1H:
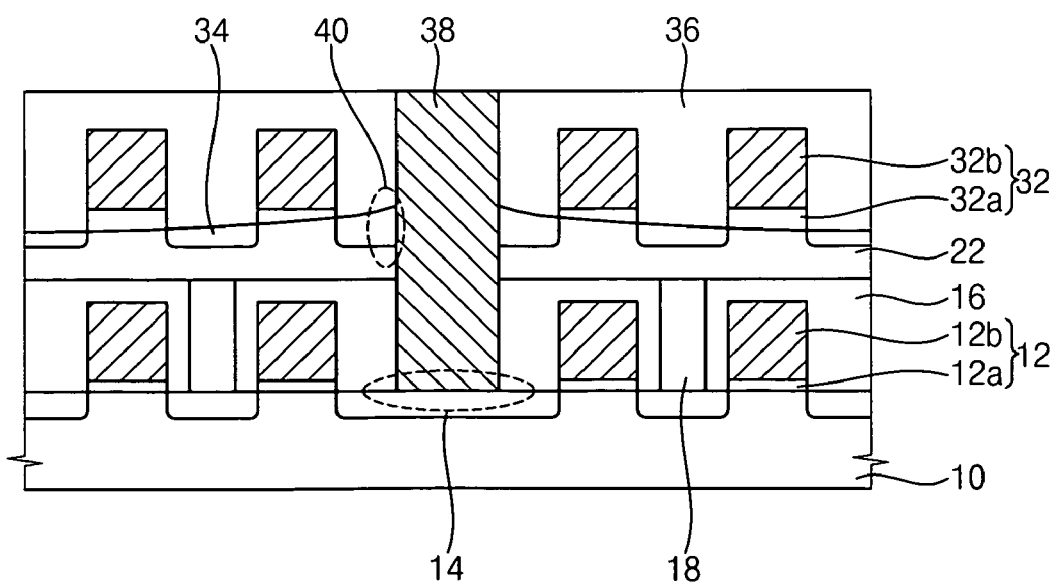

Referring to FIG. 1H, the contact hole is filled with electrically conductive material to form a contact structure 38. The contact structure thus electrically connects the source/drain region 14 of the first level to the source/drain region 34 of the second level gate structure. It can be seen that the contact 40 formed between the contact structure 38 and the sidewall of the second semiconductor substrate 22 is positioned at the former protrusion region 1, the area forming contact 40 is larger than if the contact 40 is positioned elsewhere on the second semiconductor substrate 22. According to an embodiment of the present invention, the length of the contact area at contact 40 is about 20 nm to about 400 nm. With a larger contact area, the contact resistance of contact 40 is decreased, facilitating electrical conduction with less resistance.

Figure 2:
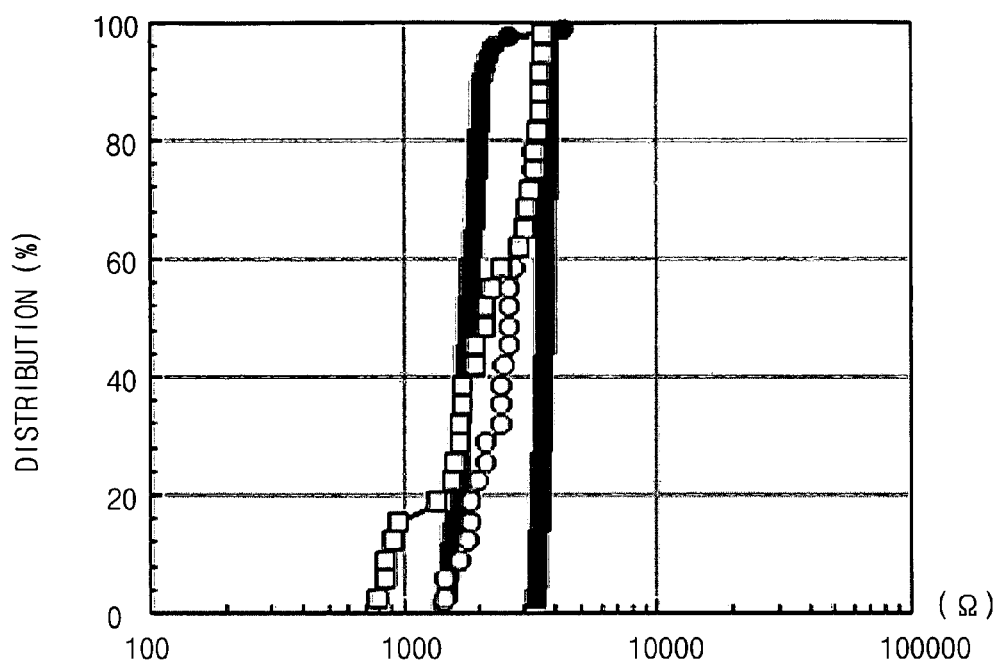
FIG. 2 is a graph showing a distribution of contact resistance of contact structures in a device according to an embodiment of the present invention and in conventional devices.

FIG. 2 illustrates a graph which shows the distribution of contact resistance of the contact area of contacts made by convention processing as compared to the contact area formed according to an embodiment of the present invention. It is found that the contact resistance is lowest for the contact area formed according to embodiments of the present invention.

A third level of circuits (not shown) can be added to the two levels of circuits by repeating the above described process in forming the second level, e.g., by etching the second interlayer dielectric layer 36 to form vias or openings at locations corresponding to seed layer 18 or elsewhere, forming an active layer to be used as the third substrate upon which transistors are formed, then forming contact structures to connect transistors of the third level to transistors of the second or first level.

The embodiments described herein are examples of structures, systems or methods having elements corresponding to the elements of the invention recited in the claims. This written description may enable those skilled in the art to make and use embodiments having alternative elements that likewise correspond to the elements of the invention recited in the claims. The intended scope of the invention thus includes other structures, systems or methods that do not differ from the literal language of the claims, and further includes other structures, systems or methods with insubstantial differences form the literal language of the claims.

What is claimed:

1. A method of fabricating a multilevel semiconductor integrated circuit, comprising:
    forming on a first active semiconductor structure a first plurality of transistors with respective gate structures disposed on a first substrate and source or drain regions disposed within the first substrate;
    depositing a first insulation layer on the first substrate and the gate structures;
    etching the first insulation layer to form a plurality of openings exposing portions of the first substrate contacting the bottoms of the openings;
    filling the openings with semiconductor material the same as in the first substrate;
    forming a second active semiconductor layer on the insulation layer and the filled openings;
    subjecting the second active semiconductor layer to at least one application of laser irradiation to form a protrusion region with a peak at or near the middle of two adjacent openings;
    forming on a second active semiconductor structure a second plurality of transistors with respective gate structures disposed on the second active semiconductor layer and sources and drains within the second active semiconductor layer;
    depositing a second insulation layer on the second active semiconductor layer and the gate structures of the second plurality of transistors;
    etching a portion of the second insulation layer at or near the peak of the protrusion region to form a contact hole extending to the surface of the first substrate; and
    depositing a conductive layer in the contact hole to form a contact structure to electrically connect a transistor of the first active semiconductor structure to a transistor of the second active semiconductor structure.

2. The method of claim 1, wherein the second active semiconductor layer is a single crystalline semiconductor layer formed by exposing an amorphous layer to a first irradiation at a first energy level and then a second laser irradiation at a second energy level, the second energy level is higher than the first energy level.

3. The method of claim 2, wherein the first energy level is set to partially melt upper portions of the amorphous layer but leave lower portions of the amorphous layer contacting the filled openings in a solid state.

4. The method of claim 2, wherein the openings are dimensioned to facilitate a predominant portion of thermal flow from the second laser irradiation as compared to the portion of thermal flow through the insulation layer, thereby forming the protrusion region having the peak.

5. The method of claim 2, wherein the thickness of the amorphous layer is less than 1000 nm.

6. The method of claim 1, wherein the thickness of the protrusion region at the peak is about 1.5 times the thickness of the second active semiconductor layer at locations adjacent to the openings.

7. The method of claim 6, wherein the thickness of the protrusion region at the thinnest portion is about 0.5 times the thickness of the peak.

8. The method of claim 1, wherein the step of filling the openings includes selective epitaxial growth from the portions of the first substrate contacting the bottom of the openings.

9. The method of claim 1, wherein the second active semiconductor layer, the filled openings, and the first substrate have a single crystalline structure.

10. The method of claim 1, wherein the semiconductor is silicon or germanium.

11. The method of claim 1, wherein the contact structure contacting the transistor of the second semiconductor structure has a contact area length greater than the thickness of the second active semiconductor layer at the openings.

12. A method of fabricating a multilevel semiconductor integrated circuit, comprising:
    forming on a first active semiconductor structure a first plurality of transistors with respective gate structures disposed on a first substrate and source or drain regions disposed within the first substrate;
    depositing a first insulation layer on the first substrate and the gate structures;
    etching the insulation layer to form a plurality of openings exposing portions of the first substrate contacting the bottoms of the openings;

forming a semiconductor seed layer filling the openings;

forming an amorphous layer on the seed layer and the insulation layer;

subjecting the first active semiconductor structure to at least one application of laser irradiation to transform the amorphous layer to a crystalline semiconductor layer having a protrusion region with a peak at or near the middle of two adjacent openings;

forming on a second active semiconductor structure a second plurality of transistors with respective gate structures disposed on the crystalline semiconductor layer and sources and drains within the crystalline semiconductor layer, wherein the second active semiconductor structure is located above the first active semiconductor structure;

depositing a second insulation layer on the crystalline semiconductor layer and the gate structures of the second plurality of transistors;

etching a portion of the second insulation layer at or near the peak of the protrusion region to form a contact hole extending to the surface of the first substrate; and depositing a conductive layer in the contact hole to form a contact structure to electrically connect a transistor of the first active semiconductor structure to a transistor of the second active semiconductor structure.

13. The method of claim 12, wherein the crystalline layer is a single crystalline semiconductor layer formed by exposing the amorphous layer to a first irradiation at a first energy level and then a second laser irradiation at a second energy level, the second energy level is higher than the first energy level.

14. The method of claim 13, wherein the first energy level is set to partially melt upper portions of the amorphous layer but leave lower portions of the amorphous layer contacting the seed layer in a solid state.

15. The method of claim 13, wherein the openings are dimensioned to facilitate a predominant portion of thermal flow from the second laser irradiation as compared to the portion of thermal flow through the insulation layer, thereby forming the protrusion region having the peak.

16. The method of claim 12, wherein the thickness of the protrusion region at the peak is about 1.5 times the thickness of the amorphous layer.

17. The method of claim 12, wherein the thickness of the protrusion region at the thinnest portion is about 0.5 times the thickness of the peak.

18. The method of claim 12, wherein the semiconductor seed layer is formed by selective epitaxial growth using the same material as the first substrate.

19. The method of claim 12, wherein the semiconductor seed layer is formed by filling the openings with material the same as the material in the first substrate.

20. The method of claim 12, wherein the semiconductor is silicon or germanium.

21. The method of claim 12, wherein the contact structure contacting the transistor of the second semiconductor structure has a contact area length greater than the thickness of the amorphous layer prior to its transformation to a crystalline layer.

* * * * *